(12) United States Patent
Chen et al.

(10) Patent No.: US 12,237,229 B2
(45) Date of Patent: Feb. 25, 2025

(54) SHALLOW TRENCH ISOLATION STRUCTURES HAVING UNIFORM STEP HEIGHTS

(71) Applicant: Taiwan Semiconductor Manufacturing Co., Ltd., Hsinchu (TW)

(72) Inventors: I-Sheng Chen, Taipei (TW); Yi-Jing Li, Hsinchu (TW); Chen-Heng Li, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 18/323,764

(22) Filed: May 25, 2023

(65) Prior Publication Data

US 2023/0298944 A1 Sep. 21, 2023

Related U.S. Application Data

(62) Division of application No. 17/225,249, filed on Apr. 8, 2021, now Pat. No. 11,699,620.

(Continued)

(51) Int. Cl.
*H01L 21/8234* (2006.01)
*H01L 21/311* (2006.01)
(Continued)

(52) U.S. Cl.
CPC .......... *H01L 21/823481* (2013.01); *H01L 21/31116* (2013.01); *H01L 21/76224* (2013.01); *H01L 21/823431* (2013.01); *H01L 27/0886* (2013.01)

(58) Field of Classification Search
CPC ..... H01L 21/76224–76237; H01L 21/823481; H01L 21/823878; H01L 29/0649–0653
See application file for complete search history.

(56) References Cited

U.S. PATENT DOCUMENTS

| 7,955,964 B2 | 6/2011 | Wu et al. |
| 8,367,534 B2 * | 2/2013 | Chen ............... H01L 21/31116 438/626 |

(Continued)

FOREIGN PATENT DOCUMENTS

| CN | 103633011 A | 3/2014 |
| CN | 110400747 A | 11/2019 |

(Continued)

OTHER PUBLICATIONS

Office Action directed to related Taiwan Patent Application No. 110118809, mailed Nov. 4, 2022; 9 pages.

*Primary Examiner* — Sonya McCall-Shepard
(74) *Attorney, Agent, or Firm* — Sterne, Kessler, Goldstein & Fox P.L.L.C.

(57) ABSTRACT

The present disclosure describes a method that includes forming a fin protruding from a substrate, the fin including a first sidewall and a second sidewall formed opposite to the first sidewall. The method also includes depositing a shallow-trench isolation (STI) material on the substrate. Depositing the STI material includes depositing a first portion of the STI material in contact with the first sidewall and depositing a second portion of the STI material in contact with the second sidewall. The method also includes performing a first etching process on the STI material to etch the first portion of the STI material at a first etching rate and the second portion of the STI material at a second etching rate greater than the first etching rate. The method also includes performing a second etching process on the STI material to etch the first portion of the STI material at a third (Continued)

etching rate and the second portion of the STI material at a fourth etching rate less than the third etching rate.

20 Claims, 13 Drawing Sheets

Related U.S. Application Data

(60) Provisional application No. 63/031,245, filed on May 28, 2020.

(51) Int. Cl.
*H01L 21/321* (2006.01)
*H01L 21/762* (2006.01)
*H01L 27/088* (2006.01)
*H01L 29/66* (2006.01)

(56) References Cited

U.S. PATENT DOCUMENTS

| | | | |
|---|---|---|---|
| 9,799,529 B2 * | 10/2017 | Yen | H01L 21/823481 |
| 9,887,096 B2 | 2/2018 | Park et al. | |
| 10,256,107 B2 | 4/2019 | Imai et al. | |
| 11,309,423 B2 | 4/2022 | Chen et al. | |
| 11,322,601 B2 | 5/2022 | Ghani et al. | |
| 2008/0305611 A1 | 12/2008 | Hirota | |
| 2014/0315371 A1 | 10/2014 | Cai et al. | |
| 2016/0071932 A1 * | 3/2016 | Sung | H01L 21/823821 |
| | | | 257/369 |
| 2016/0322462 A1 | 11/2016 | Chou et al. | |
| 2017/0236717 A1 * | 8/2017 | Briggs | H01L 21/31056 |
| | | | 438/701 |
| 2017/0243753 A1 | 8/2017 | Imai et al. | |
| 2017/0263503 A1 * | 9/2017 | Bi | H01L 21/823821 |
| 2018/0090385 A1 | 3/2018 | Bi et al. | |
| 2019/0043857 A1 * | 2/2019 | Wu | H01L 21/823431 |
| 2019/0097026 A1 * | 3/2019 | Hung | H01L 29/66795 |
| 2020/0075342 A1 | 3/2020 | Chen et al. | |
| 2020/0211894 A1 | 7/2020 | Tianhao et al. | |

FOREIGN PATENT DOCUMENTS

| | | |
|---|---|---|
| DE | 102018126911 A1 | 6/2019 |
| EP | 3561878 A1 | 10/2019 |
| JP | 2007250907 A | 9/2007 |
| TW | 201426855 A | 7/2014 |
| TW | 201740448 A | 11/2017 |
| TW | 201913753 A | 4/2019 |

* cited by examiner

SHALLOW TRENCH ISOLATION STRUCTURES HAVING UNIFORM STEP HEIGHTS

CROSS-REFERENCE TO RELATED APPLICATIONS

The present application is a divisional application of U.S. patent application Ser. No. 17/225,249, titled "Shallow Trench Isolation Structures Having Uniform Step Heights," filed on Apr. 8, 2021, which claims the benefit of U.S. Provisional Patent Appl. No. 63/031,245, titled "Shallow Trench Isolation (STI) Structures Having Uniform Step Heights" and filed on May 28, 2020, all of which are incorporated herein by references in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Fin-type field effect transistors (finFETs) have been developed to reduce device footprint and improve device performance. FinFETs are FETs formed over a fin that is vertically oriented with respect to a planar surface of a wafer.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
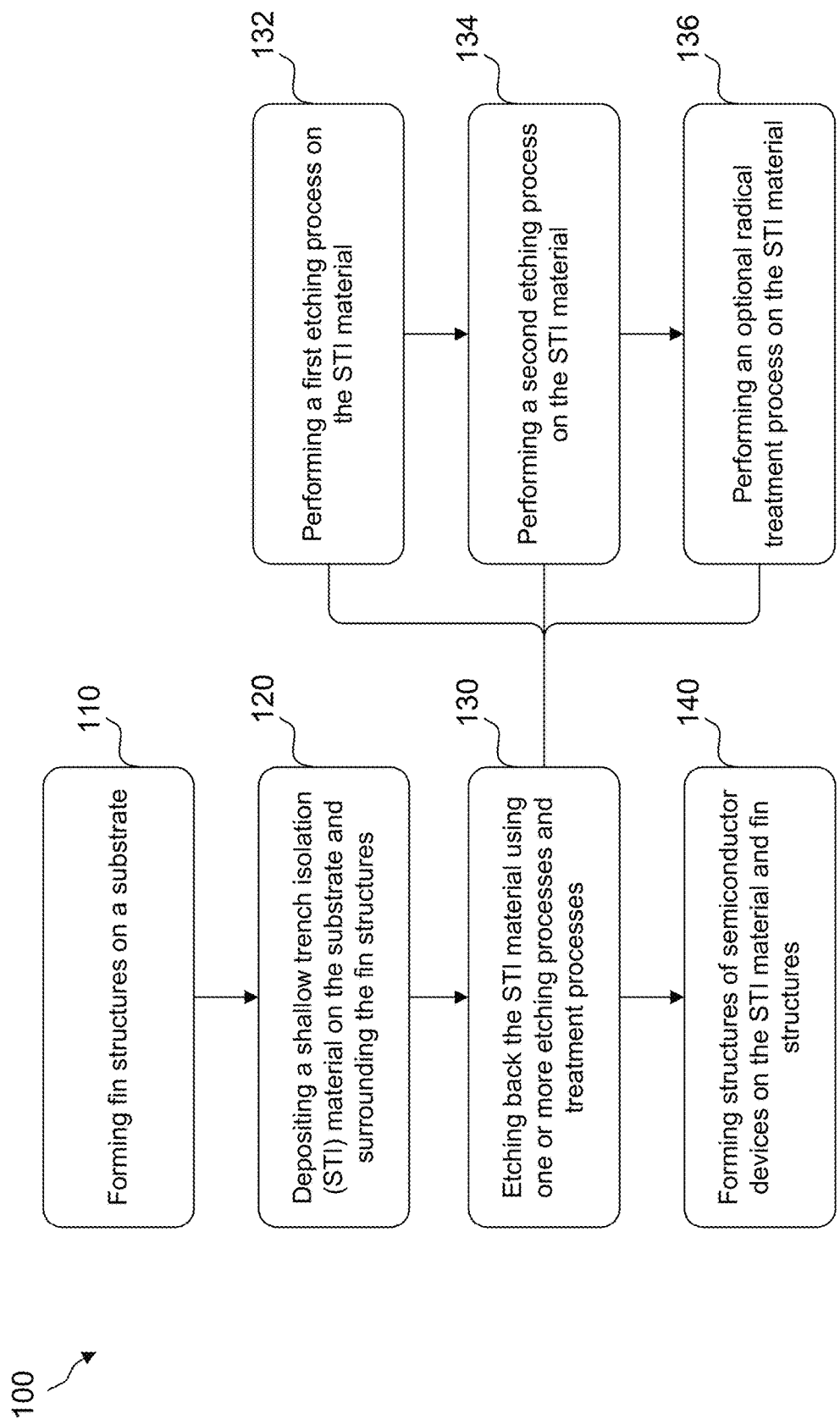
FIG. 1 is a flow diagram of a method for forming a semiconductor structure, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The present disclosure provides methods for forming finFET devices. The term "finFET" refers to a FET formed over a fin that is vertically oriented with respect to a planar surface of a wafer. The term "vertical," as used herein, refers to nominally perpendicular to the surface of a substrate. The methods can also be applied towards forming any suitable semiconductor structures, such as horizontal or vertical gate-all-around FETs (GAAFETs).

The performance and scalability of silicon-based transistors is reaching fundamental limits despite the implementation of various enhancement techniques, such as novel device architectures for enhanced electrostatic control, transport enhancement by strained channels, improved dopant activation, and parasitic resistance reduction. As device dimensions are scaled down to achieve higher packing density, it has been a challenge to shrink silicon-based transistors. FinFETs have been developed to reduce device footprint and improve device performance. The fins of finFETs may be formed on a semiconductor substrate by one or more photolithography processes, including double-patterning or multi-patterning processes. After fins are formed, a layer of shallow trench isolation (STI) material can be deposited on the substrate and surrounding the fins, providing electrical isolation between adjacent fins. Source/drain regions and channel regions of FETs can be formed on portions of the fins that protrude from a top surface of the STI material. However, as device dimensions are scaled down, heights of STI material can vary across the wafer and cause fin height non-uniformity. For example, due to loading effects, the step height of STI material between fins can be greater than the step height of STI material formed surrounding an outermost fin of a group of fins.

Various embodiments in the present disclosure describe methods for forming semiconductor devices with substantially uniform STI step heights. An STI material can be deposited on a substrate and surround multiple fins, followed by an etch back process to expose portions of the fins. Semiconductor devices formed using the methods disclosed herein can have substantially uniform STI step height across multiple fins. For example, an inner STI step height (e.g., STI step height between adjacent fins) can be substantially equal to an outer STI step height (e.g., STI step height for the outermost fin). Multiple etching processes can be used to achieve substantially uniform STI step heights. For example, the etching back process can include etching processes that removes STI material at different rates depending on the location of the targeted STI material. For example, a thermal etching process can etch STI material formed adjacent to the outermost fin at a greater etching rate than STI material formed between a pair of adjacent fins. A plasma-activated etching process can remove STI material at a greater rate from between adjacent fins than removing STI material that is adjacent to the outermost fin. The etched STI material can be exposed to a radical treatment process, during which surfaces of the etched STI material can be exposed to hydrogen radicals. The radical treatment process can adjust the surface profile of the STI material as well as further etching the STI material. A combination of multiple etching and treatment process can provide the benefits of, among other things, substantially uniform STI step height throughout multiple fins. For example, inner STI step height can be substantially similar to the outer STI step heights. In some embodiments, STI step heights can be tuned using the etching and treatment process to achieve different step heights based on device needs. For example, inner STI step heights can be greater than outer step heights.

FIG. 1 is a flow diagram of a method 100 for forming STI material having substantially uniform step height, according to some embodiments. For illustrative purposes, the operations illustrated in FIG. 1 will be described with reference to the example fabrication process illustrated in FIGS. 2-6. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Figure 2:
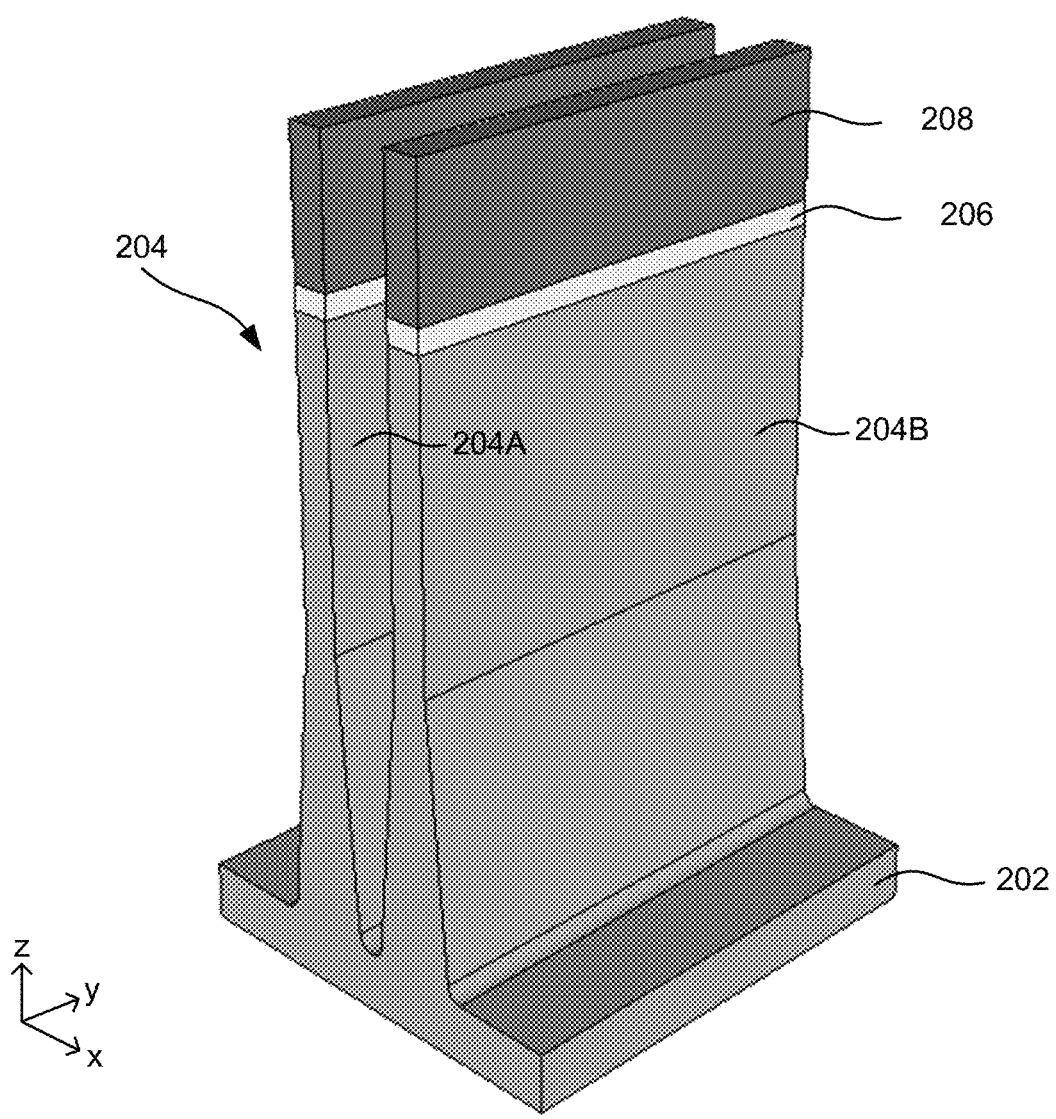
FIGS. 2-6 illustrate various views of semiconductor fins and STI material at various stages of their fabrication process, in accordance with some embodiments.

Referring to FIG. 1, in operation 110, fin structures are formed on a substrate, according to some embodiments. As shown in FIG. 2, multiple fins 204 can be formed on a substrate 202 and protrude from a top surface of substrate 202. In some embodiments, substrate 202 can be a wafer and formed using suitable materials, such as an elementary semiconductor, a compound semiconductor, an alloy semiconductor, and any suitable materials. In some embodiments, substrate 202 includes a crystalline silicon substrate (e.g., wafer). In some embodiments, substrate 202 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 202 can be doped depending on design requirements (e.g., p-type substrate or n-type substrate). In some embodiments, substrate 202 can be doped with p-type dopants (e.g., boron, indium, aluminum, or gallium) or n-type dopants (e.g., phosphorus or arsenic).

Figure 3:
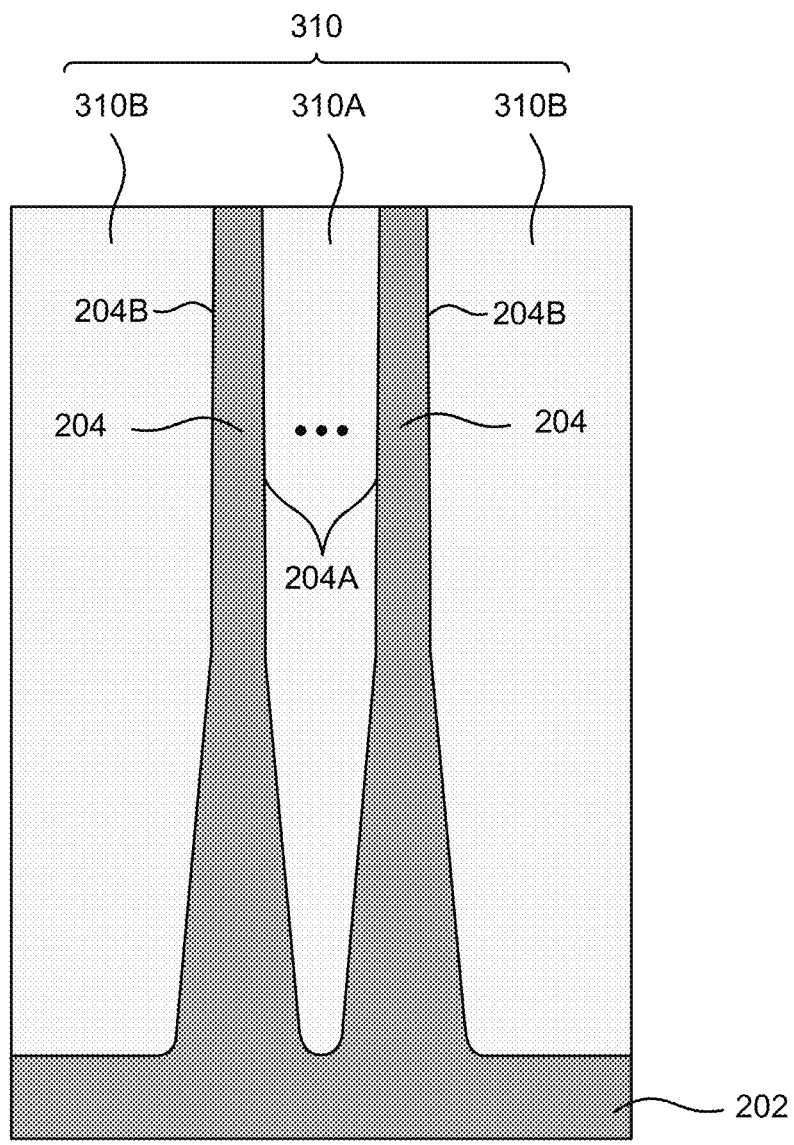

Fins 204 traverse along a Y-axis. Although a pair of fins 204 are illustrated in FIG. 3, additional fins are formed between the pair of fins 204 to form multiple fins and the pair of fins 204 represent the outermost fins of the multiple fins. The additional fins are referred to herein as inner fins and are not illustrated for simplicity. Outermost fins 204 can have inner sidewalls 204A facing toward the inner fins and outer sidewalls 204B on the opposing side, as shown in FIG. 3. Inner fins can have inner sidewalls that opposes inner sidewalls from adjacent inner fins and inner sidewalls 204A of outermost fins 204. Top surfaces of fins 204 can be substantially coplanar (e.g., aligned on the same horizontal plane).

In some embodiments, fins 204 can include material similar to substrate 202. In some embodiments, fins 204 can be formed from a photolithographic patterning and an etching of substrate 202. Based on the disclosure herein, it will be recognized that other materials for fins 204 are within the scope and spirit of this disclosure. Fins 204 are current-carrying structures for finFETs. Channel regions (not shown) of finFETs can be formed in portions of fin structures 204. In some embodiments, each fin of fins 204 can include multiple nanowire structures (not shown) for forming GAAFET devices. Fins 204 can be formed by etching substrate 202 through patterned first and second hard mask layers 206 and 208 formed on un-etched substrate 202. In some embodiments, first hard mask layer 206 is a thin film including silicon oxide formed using a thermal oxidation process. In some embodiments, second hard mask layer 208 can be formed of silicon nitride using low pressure chemical vapor deposition (LPCVD) or plasma enhanced CVD (PECVD). In some embodiments, fins 204 can include a top portion 204A having substantially uniform width along the X-axis and a bottom portion 204B having a width that gradually changes along the Z-axis.

Referring to FIG. 1, in operation 120, a shallow trench isolation (STI) material is deposited on the substrate and surrounds the fin structures, according to some embodiments. As shown in FIG. 3, STI material 310 is deposited on substrate 202 and surrounds fins 204. STI material 310 can include inner portion 310A deposited on substrate 202 and between adjacent fins 204. STI material 310 can also include outer portions 310B deposited on substrate 202 and on outer sidewalls of outermost fins 204. Inner portions 310A can be formed between outermost fins and between adjacent inner fins formed between the outermost fins. STI material 310 can electrically isolate adjacent fins from neighboring active and passive elements (not illustrated herein) integrated with or deposited onto substrate 202. STI material 310 can be made of a dielectric material. In some embodiments, STI material 310 can include silicon oxide, silicon nitride, silicon oxynitride, fluorine-doped silicate glass (FSG), a low-k dielectric material, and/or other suitable insulating material. In some embodiments, STI material 310 can be formed by depositing a flowable dielectric material, such as flowable silicon oxide, flowable silicon nitride, flowable silicon oxynitride, flowable silicon carbide, or flowable silicon oxycarbide. For example, flowable silicon oxide can be deposited using flowable CVD (FCVD). In some embodiments, STI material 310 can be deposited using other suitable CVD processes, physical vapor deposition (PVD), atomic layer deposition (ALD), or any suitable deposition processes. A planarization process can be used after the deposition of STI material 310 to remove hard mask layers 206 and 208 such that top surfaces of fins 204 and STI material 310 are substantially coplanar (e.g., level with each other).

Referring to FIG. 1, in operation 130, the shallow trench isolation (STI) material is etched back using one or more etching processes and treatment processes, according to some embodiments. An exemplary operation 130 can include operation 132 which includes performing a first etching process, operation 134 which includes performing a second etching process, and operation 136 which includes an optional radical treatment process 136. Operations 132 and 134 can remove STI material 310 at different etching rates depending on the location of the targeted STI material. For example, operation 132 can be a thermal etching process that etches outer portions 310B of STI material 310 at a greater etching rate than inner portions 310A of STI material 310. In contrast, operation 134 can be a plasma-activated etching process that removes inner portions 310A at a greater rate than removing outer portions 310B. The etching and treatment processes described in operation 130 can be performed in a different order or not performed depending on specific applications.

Figure 4:
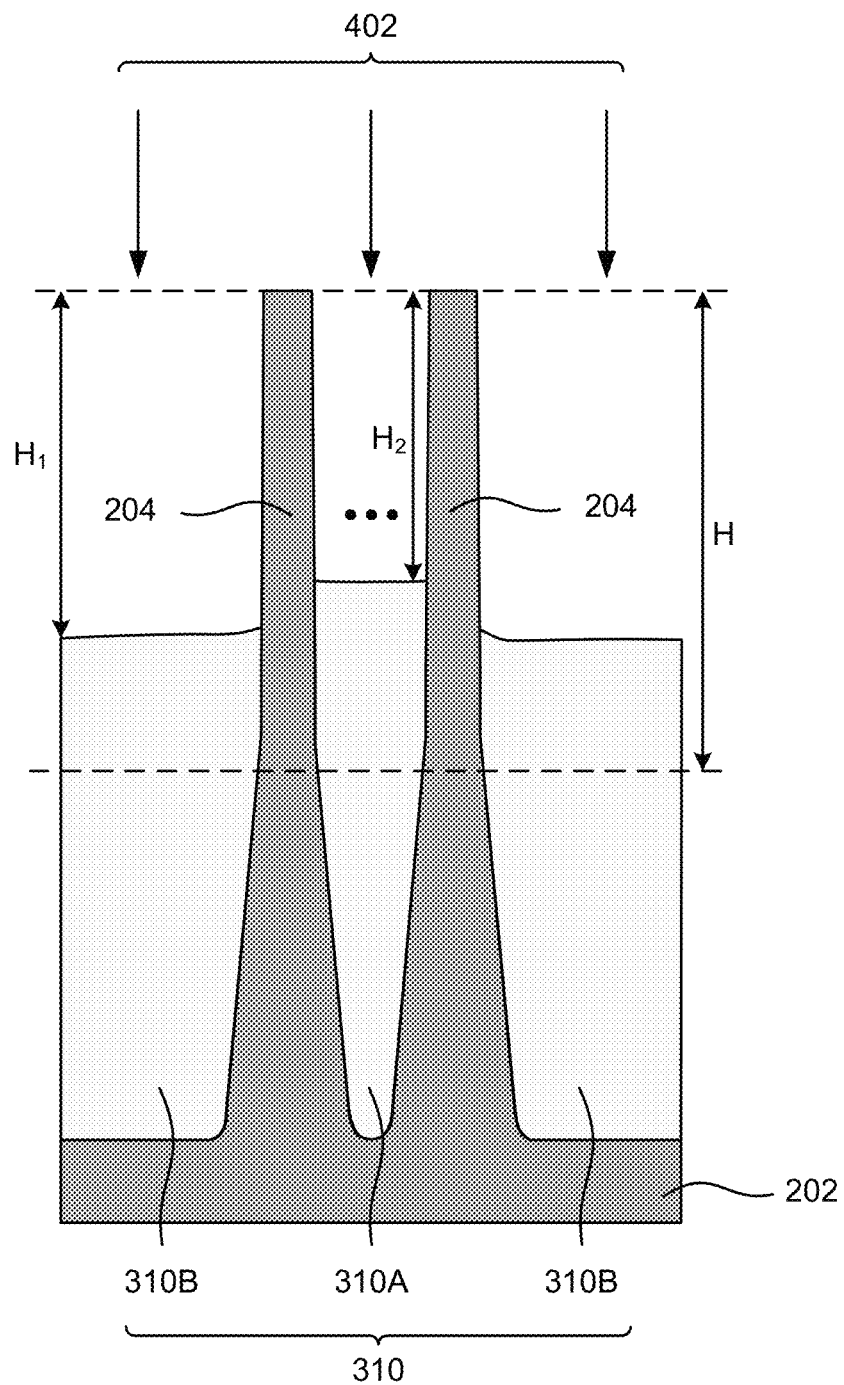

Referring to FIG. 1, in operation 132, a first etching process is performed, according to some embodiments. As shown in FIG. 4, a first etching process 402 can be performed to etch back a portion of STI material 310. In some embodiments, first etching process 402 can be a thermal etching process using ammonia ($NH_3$) and hydrogen fluoride (HF) as precursors. First etching process 402 can be a non-plasma etching process and performed at an elevated temperature. First etching process 402 can etch STI material 310 at different rates depending on the location of the targeted STI material. For example, the etching rate $E_1$ of first etching process 402 in outer portions 310B of STI material 310 is greater than the etching rate $E_2$ for inner portions 310A of STI material 310. The etching rate difference can be attributed to the pattern loading effect, a phenomenon that is derived from differences in radiant energy absorption in different areas of a semiconductor device or die on account of the different patterning (e.g., pattern density, aspect ratio of features, composition/reflectivity of features, etc.). In some embodiments, a ratio $N_1$ of etching rate $E_1$ over etching rate $E_2$ can be about 1 and about 2, or any suitable ratios. For example, ratio $N_1$ can be greater than or equal to about 1 and less than about 2. Etching rate differences greater than the aforementioned ranges of $N_1$ can lead to etching non-uniformity that can be challenging to address. The value of ratio $N_1$ can depend on the separation between adjacent fins of multiple fins. Decreasing the separation between fins can result in a greater etch rate difference between etching rates $E_1$ and $E_2$. The precursor flow rates and etching temperature can be adjusted such that the ratio $N_1$ is within the aforementioned ranges.

First etching process 402 can proceed until a nominal etching height of STI material is removed. In some embodiments, the height of STI material removed from outer portions 310B of STI material can be denoted as $H_1$, measured from top surfaces of fins 204 and a top planar surface of etched outer portions 310B. Similarly, the height of STI material removed from inner portions 310A of STI material can be denoted as $H_2$, measured from top surfaces of fins 204 and a top planar surface of etched inner portions 310A. In some embodiments, a total height of STI material to be removed can be denoted as H, measured from a top surface of fins 204 and a targeted top surface of remaining STI material. In some embodiments, a ratio $N_2$ of heights $H_1$ over $H_2$ can be equal to ratio $N_1$. In some embodiments, first etching process 402 can remove the majority of the total STI to be removed. In some embodiments, a ratio $N_3$ of height $H_1$ over total height H can be between about 0.65 and about 0.90. A value of ratio $N_3$ outside of the aforementioned ranges can result in limited device performance gain or lower yield.

In some embodiments, gas sources can dispense precursors at predetermined flow rates for first etching process 402. For example, a gas source can dispense ammonia precursors into an etching chamber at a flow rate of from about 5 standard cubic centimeters per minute (sccm) to about 110 sccm, from about 10 sccm to about 100 sccm, or any suitable flow rates. The gas source can also dispense hydrogen fluoride precursors at a flow rate of from about 80 sccm to about 1200 sccm, from about 90 sccm to about 1100 sccm, from about 100 sccm to about 1000 sccm, or any suitable flow rates. Values of flow rates that are outside the aforementioned ranges can result in limited device performance gain or lower yield. In some embodiments, the etching chamber can be a chamber configured to conduct a Siconi etching process (e.g., a plasma-assisted dry etching process). In some embodiments, STI material 310 can be formed using silicon oxide. Chemical reactions during first etching process 402 can include generating ammonium fluoride ($NH_4F$) molecules using the dispensed precursors. When exposed to ammonium fluoride molecules, the silicon oxide material of STI material 310 can react to generate ammonium hexafluorosilicate (($NH_4)_2SiF_6$) which in turn reacts with water and generates byproducts of silicon tetrafluoride ($SiF_4$). Some of the chain chemical reactions of first etching process 402 can be represented using the following chemical representations: $NH_3 + HF \rightarrow NH_4F$ and $SiO_2 + NH_4F \rightarrow (NH_4)_2SiF_6 + H_2O \rightarrow SiF_4(g) + NH_3(g) + HF(g)$.

In some embodiments, first etching process 402 can be performed at a temperature between about 25° C. and about 50° C. For example, the etching chamber used to perform first etching process 402 can be maintained at a temperature between about 25° C. and about 30° C., between about 30° C. and about 35° C., between about 35° C. and about 40° C., between about 40° C. and about 45° C., between about 45° C. and about 50° C., or any suitable temperatures. Temperatures below or above the aforementioned ranges can cause low chemical reactivity of the precursors which can in turn lead to low etching rates or ineffective etching.

Figure 5:
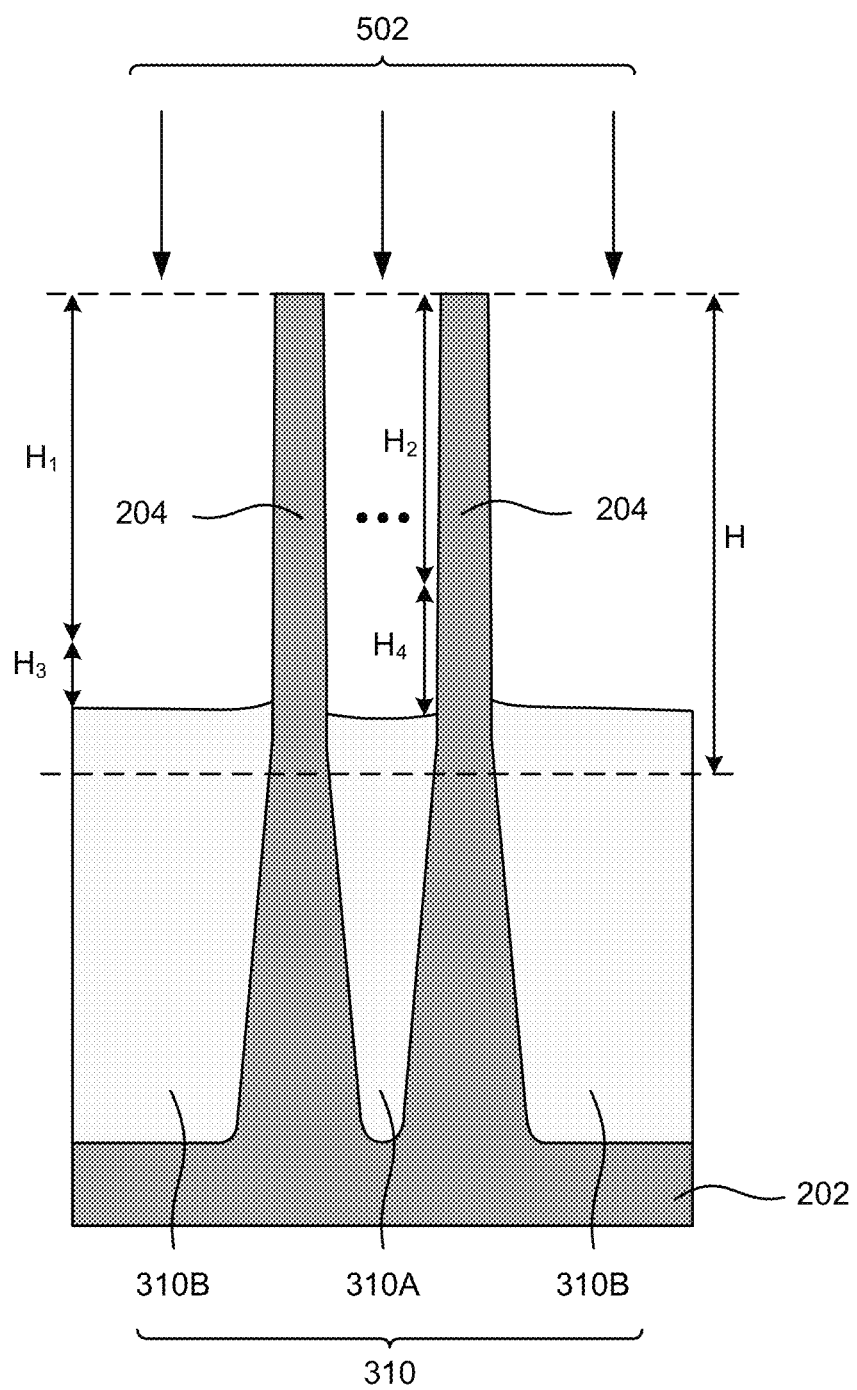

Referring to FIG. 1, in operation 134, a second etching process is applied to further remove STI material, according to some embodiments. As shown in FIG. 5, a second etching process 502 can be performed to further etch back STI material 310. In some embodiments, second etching process 502 can be a plasma-activated etching process using ammonia ($NH_3$) and nitrogen trifluoride ($NF_3$) as precursors. Second etching process 502 can be a plasma-activated etching process using a plasma etching apparatus. The plasma can be generated in a plasma generation process by a plasma generator such as a transformer-coupled plasma generator, inductively coupled plasma system, magnetically enhanced reactive ion etching system, electron cyclotron resonance system, remote plasma generator, or the like. The plasma generator generates radio frequency power that produces a plasma from ammonia and nitrogen trifluoride fluoride, such as by applying a voltage above the striking voltage to electrodes in a chamber containing the precursors. Compared to first etching process 402, second etching process 502 can remove STI material 310 at lower rates on outer portions than inner portions of STI material, according to some embodiments. For example, the etching rate $E_3$ of second etching process 502 in outer portions 310B of STI material 310 can be lower than the etching rate $E_4$ for inner portions 310A. The etching rate difference can be attributed to the generation of ammonia fluoride radicals that can assist in etching in tight spaces, such as the STI material located between adjacent fins. In some embodiments, remnant traces of oxygen in the process chamber can form a layer of native oxide on fins 204 during first and second etching processes 402 and 502. Plasma species used in second etching process 502 (e.g., $NH_3$ and $NF_3$) can etch native oxide at an etching rate that is slower than plasma species used in first etching process 402 (e.g., $NH_3$ and HF), therefore providing more radicals in the tight spaces between fins for increasing the etching rate of STI material 310. In some embodiments, a ratio $N_4$ of etching rate $E_3$ over etching rate $E_4$ can be less than or equal to 1 and greater than about 0.5. Etching rate differences greater than the aforementioned ranges of $N_4$ can lead to challenges in providing a substantially uniform etch across multiple fins. The precursor flow rates and plasma intensity can be adjusted such that the ratio $N_4$ is within the aforementioned ranges. Second etching process 502 can proceed until a nominal etching height of STI material is removed. In some embodiments, the height of STI material removed from outer portions 310B of STI material during second etching process 502 can be denoted as $H_3$. Similarly, the height of STI material removed from inner portions 310A of STI material during second etching process 502 can be denoted as $H_4$. In some embodiments, a ratio $N_5$ of heights $H_3$ over $H_4$ can be equal to ratio $N_4$. In some embodiments, second etching process 502 can remove a smaller amount of STI material than first etching process 402. In some embodiments, a ratio $N_6$ of height $H_3$ over total height H can be between about 0.10 and about 0.35. In some embodiments, second etching process 502 can be used to counter the surface unevenness (e.g., differences in heights $H_1$ and $H_2$) caused by first etching process 402 such that after first and second etching process 402 and 502, the top surfaces of inner portions 310A and outer portions 310B are substantially coplanar (e.g., level). Second etching process can continue until a nominal fin height (e.g., height of fin 204 protruding from STI material 310) or until the top surfaces of inner and outer portions 310A and 310B are substantially coplanar. In some embodiments, second etching process can proceed until top surfaces of inner portions 310A are lower than top surfaces of outer portions 310B.

In some embodiments, gas sources can dispense precursors at predetermined flow rates for second etching process 502. For example, a gas source can dispense ammonia precursors into an etching chamber at a flow rate of from about 5 sccm to about 320 sccm, from about 7 sccm to about 310 sccm, from about 10 sccm to about 300 sccm, or any suitable flow rates. The gas source can also dispense nitrogen trifluoride precursors at a flow rate of from about 35 sccm to about 600 sccm, from about 40 sccm to about 550 sccm, from about 50 sccm to about 500 sccm, or any suitable flow rates. In some embodiments, STI material 310 can be formed using silicon oxide. Chemical reactions during second etching process 502 can include generating ammonium fluoride ($NH_4F$) radicals as well as ammonium fluoride molecules using the dispensed precursors and under plasma. When exposed to ammonium fluoride molecules and radicals, the silicon oxide material of STI material 310 can react to generate ammonium hexafluorosilicate which in turn reacts with water and generate byproducts of silicon tetrafluoride. Some of the chain chemical reactions of second etching process 502 can be represented using the following chemical representations: $NH_3+NF_4\rightarrow$plasma $(RF)\rightarrow NH_4F+NH_4F\cdot HF$ and $SiO_2+NH_4F\rightarrow(NH_4)_2SiF_6+H_2O\rightarrow SiF_4(g)+NH_3(g)+HF(g)$. In some embodiments, an anneal process can be used during or after the etching process. For example, an annealing process can be performed to enhance the generation of silicon tetrafluoride gas. In some embodiments, the anneal process can be performed at a temperature between about 30° C. and about 80° C. Annealing processes performed at a temperature below about 30° C. can lead to insufficient sublimation of $(NH_4)_2SiF_6$, which in turn can result in poor etching performance (e.g., residue or defect generation). Annealing processes performed at temperatures greater than about 80° C. can result in unstable plasma species which in turn can lead to plasma degradation.

In some embodiments, second etching process 502 can be performed in a plasma chamber. A radio frequency (RF) source can be applied to the plasma chamber to excite the ions from precursors and create plasma. The power of the RF source can be between about 25 W and about 75 W. For example, the power can be between about 25 W and about 40 W, between about 40 W and about 50 W, between about 50 W and about 75 W, or any suitable RF power. RF power below the aforementioned ranges can cause low chemical reactivity of the precursors which can in turn lead to low etching rates or ineffective etching. RF power greater than the aforementioned ranges can lead to challenges in providing a consistent etching rate.

Figure 6:
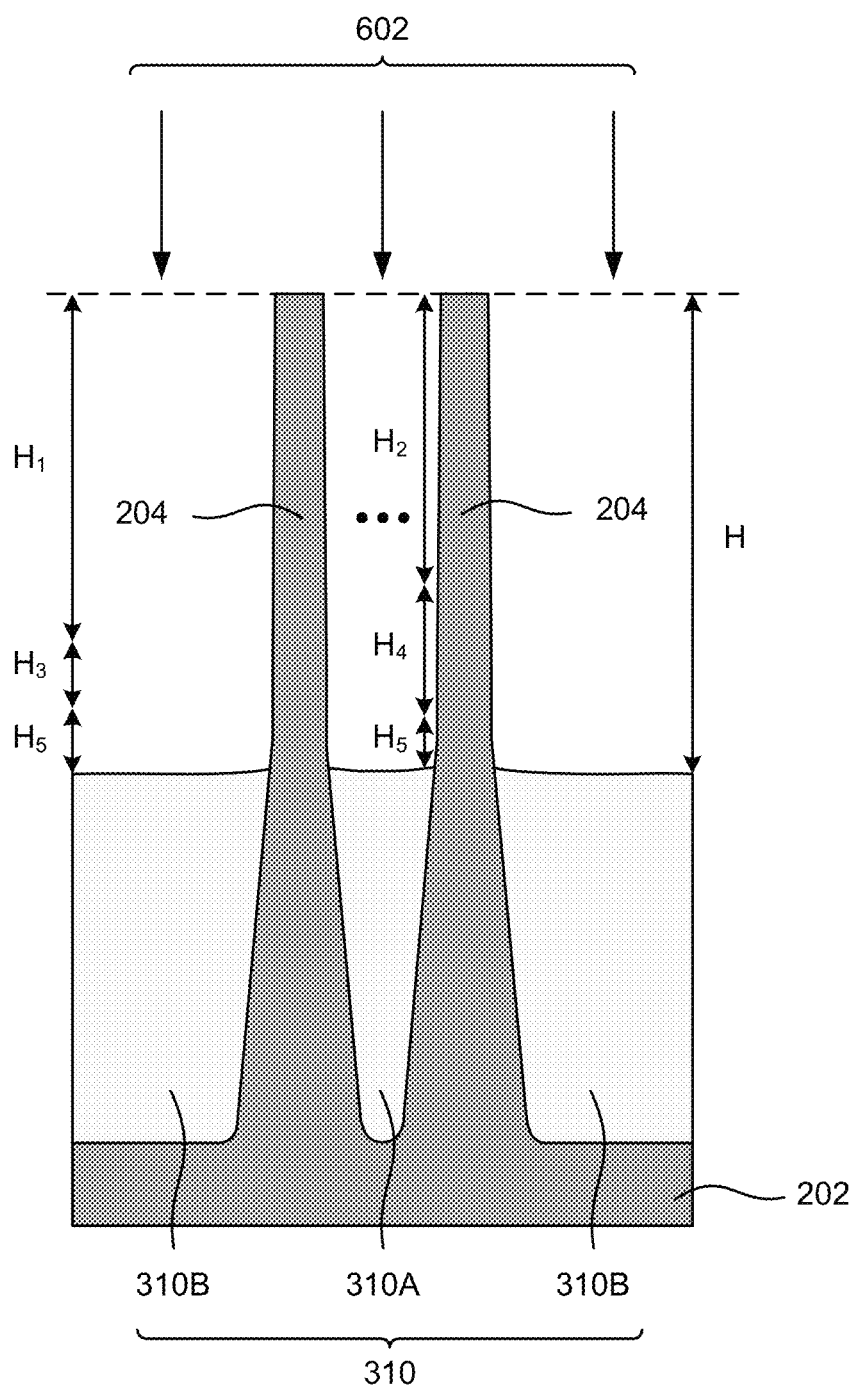

Referring to FIG. 1, in operation 136, a radical treatment process is applied to on the STI material, according to some embodiments. As shown in FIG. 6, a radical treatment process 602 is applied to the top surfaces of STI material 310. In some embodiments, radical treatment process can be optional. The radical treatment process can be a hydrogen radical treatment process, in which surfaces of STI material 310 are exposed to hydrogen radicals. Hydrogen radicals readily react with Group IV materials to form tetrahydride compounds. The hydrogen radical treatment process can be performed in a chamber, such as an etching chamber. In some embodiments, radical treatment process 602 can be performed in the processing chambers used to perform first and second etching processes 402 and 502. In some embodiments, radical treatment process 602 can be a plasma-assisted radical treatment process. For example, the plasma-assisted radical treatment process can use hydrogen or helium as precursors. For example, one or more gas sources are dispensed in the etching chamber. The gas source includes a precursor gas and an inert gas. The precursor gas can include hydrogen ($H_2$), and the inert gas can include argon (Ar), helium (He), or a combination thereof. A plasma is generated after the precursor gases are dispensed into the processing chamber. The plasma can be generated in a plasma generation process by a plasma generator. When exposed to the hydrogen plasma, the material (e.g., silicon oxide) at the surface of the STI material 310 breaks apart and recombines with the free hydrogen ions to form silane ($SiH_4$) and water ($H_2O$), thus removing the dielectric material at top surfaces of STI material 310. The byproducts can be removed from the processing chamber during their formation by vacuuming. As shown in FIG. 6, dielectric material can be uniformly removed from inner portions 310A and outer portions 310B of STI material 310. In some embodiments, the height of STI material removed from inner portions 310A and outer portions 310B of STI material during radical treatment process 602 can be denoted as $H_5$. In some embodiments, a ratio $N_7$ of height $H_5$ over total height H can be less than about 0.05.

FIGS. 7-11 are flow diagrams of methods for etching back STI material to expose multiple fins, according to some embodiments. For illustrative purposes, the operations illustrated in FIGS. 7-11 can be similar to those illustrated in FIGS. 2-6. For example, each of the methods described in FIGS. 7-11 can be used for performing operation 130 described in FIG. 1. Operations can be performed in a different order or not performed depending on specific applications. It should be noted that the methods described in FIGS. 7-11 are for etching back STI material and may not produce a complete semiconductor device. Accordingly, it is understood that additional processes can be provided before, during, and after the methods disclosed herein, and that some other processes may only be briefly described.

Figure 7:
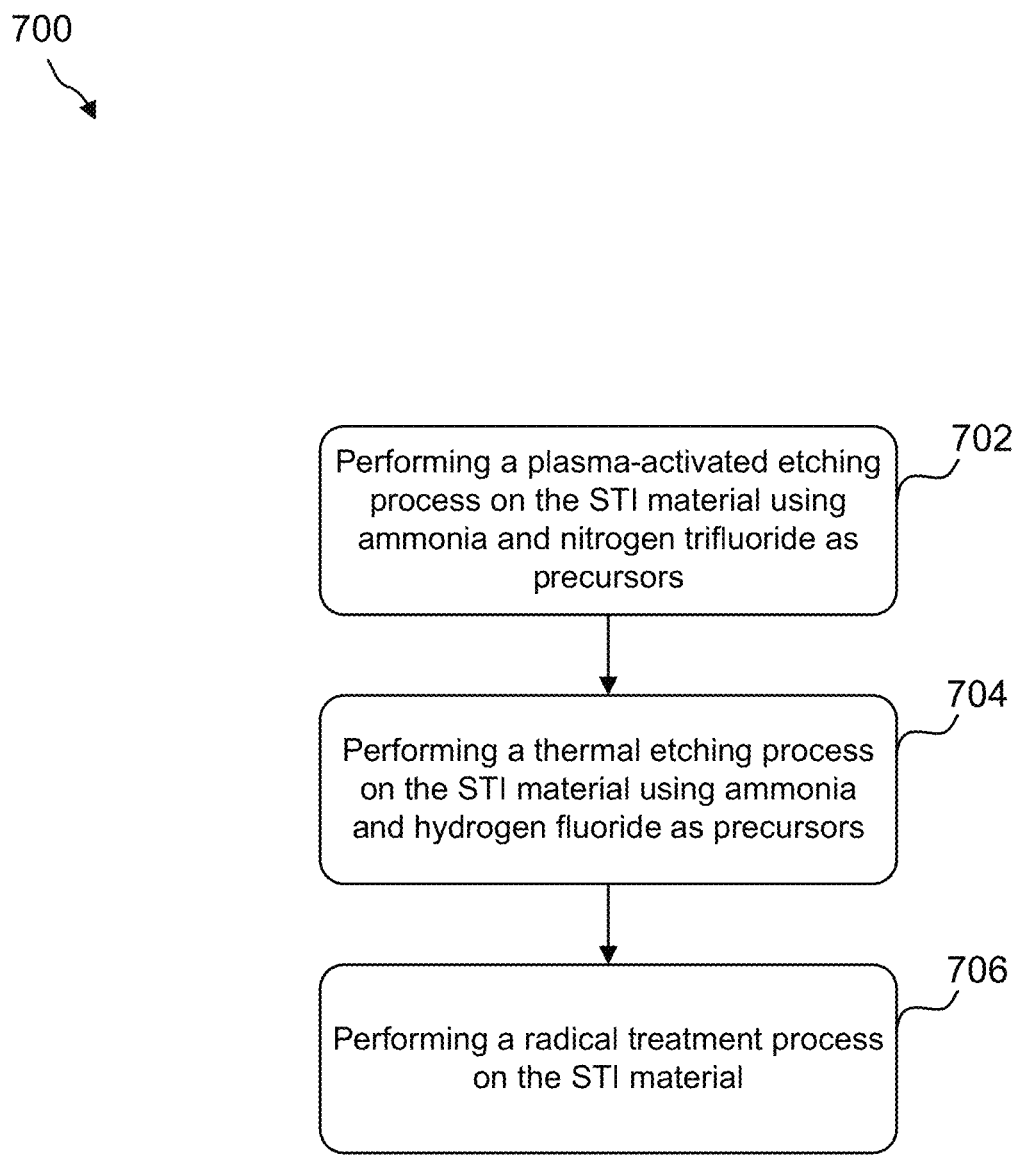
FIGS. 7-11 are flow diagrams of methods for forming semiconductor structures, in accordance with some embodiments.

Referring to FIG. 7, method 700 can include operation 702 that includes a plasma-activated etching process, operation 704 that includes a thermal etching process, and operation 706 that includes a radical treatment process. In some embodiments, the plasma-activated etching process in operation 702 can be similar to second etching process described with reference to FIG. 5. For example, the plasma-activated etching process in operation 702 can have different etching rates on inner portions and outer portions of the STI material. In some embodiments, the removed material from the outer portions of the STI material can have a height between about 10% and 35% of the total height of the STI material to be removed. In some embodiments, the thermal etching process of operation 704 can be similar to first etching process 402 described in FIG. 4. For example, the thermal etching process of operation 704 can remove STI material at a greater rate in the outer portions of the STI material than the inner portions of the STI material. In some embodiments, the removed material from the outer portions of the STI material during operation 704 can be between about 65% and about 90% of the total height of the STI material to be removed. Second operations 702 and 704 can be followed by operation 706 which includes performing a radical treatment process that is similar to radical treatment process 602 described in FIG. 6. For example, a hydrogen radical treatment process can be performed to further remove STI material. After the operations described in method 700, the top surfaces of inner portions and outer portions of etched-back STI material can be substantially coplanar. In some embodiments, top surfaces of the inner portions can be lower than the top surfaces of the outer portions.

Figure 8:
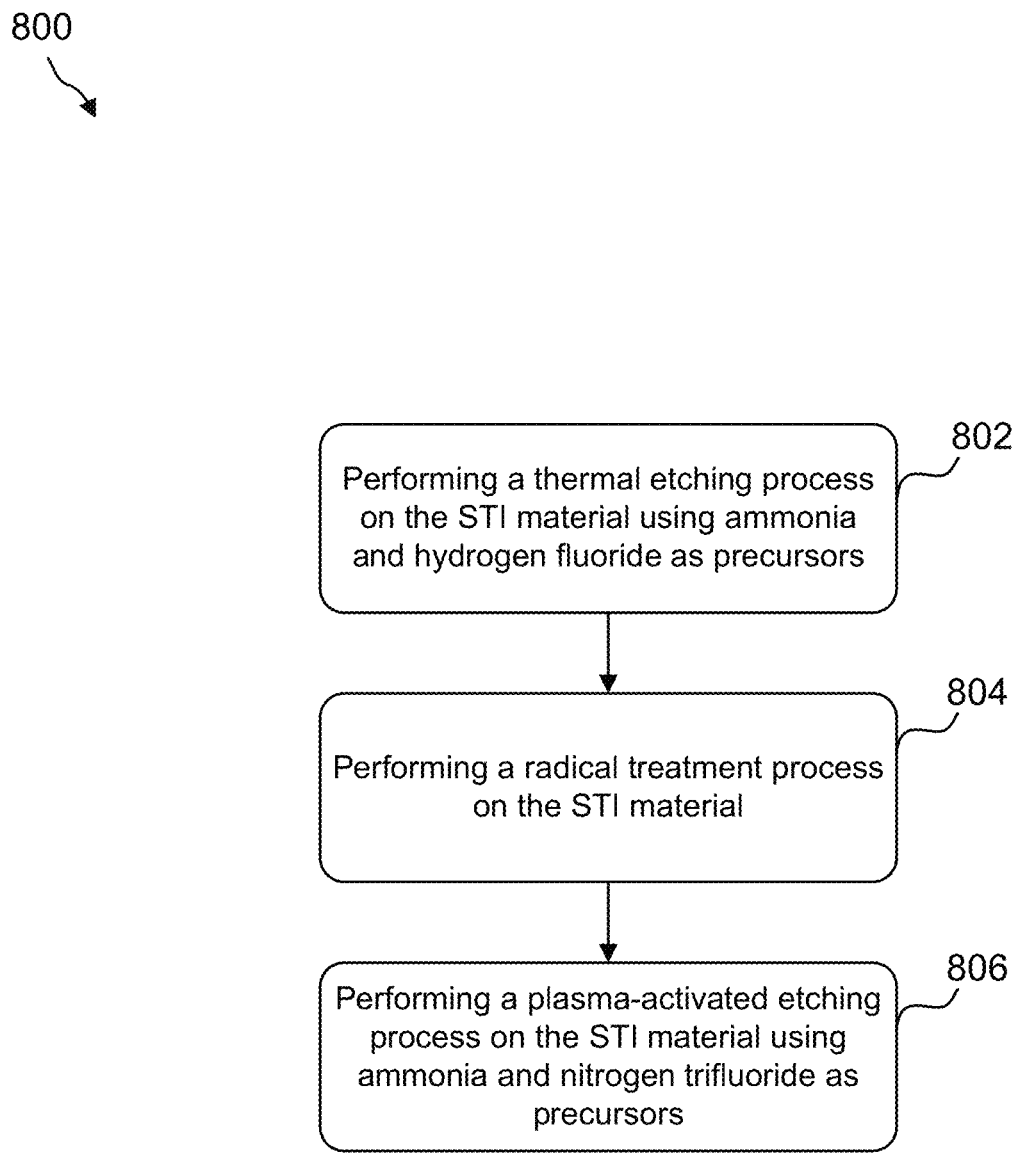

Referring to FIG. 8, method 800 can include operation 802 that includes a thermal etching process, operation 804 that includes a radical treatment process, and operation 806 that includes a plasma-activated etching process. In some embodiments, the thermal etching process of operation 802 can be similar to first etching process 402 described in FIG. 4. For example, the thermal etching process of operation 802 can remove STI material at a greater rate in the outer portions of the STI material than the inner portions of the STI material. In some embodiments, the removed material from the outer portions of the STI material during operation 802 can be between about 65% and about 90% of the total height of the STI material to be removed. Operation 804 can include a radical treatment process that is similar to radical treatment process 602 described in FIG. 6. For example, a hydrogen radical treatment process can be performed to further remove STI material. In some embodiments, the plasma-activated etching process in operation 804 can be similar to second etching process 502 described with reference to FIG. 5. For example, the plasma-activated etching process in operation 804 can have different etching rates on inner portions and outer portions of the STI material. In some embodiments, the removed material from the outer portions of the STI material can have a height between about 10% and 35% of the total height of the STI material to be removed.

Figure 9:
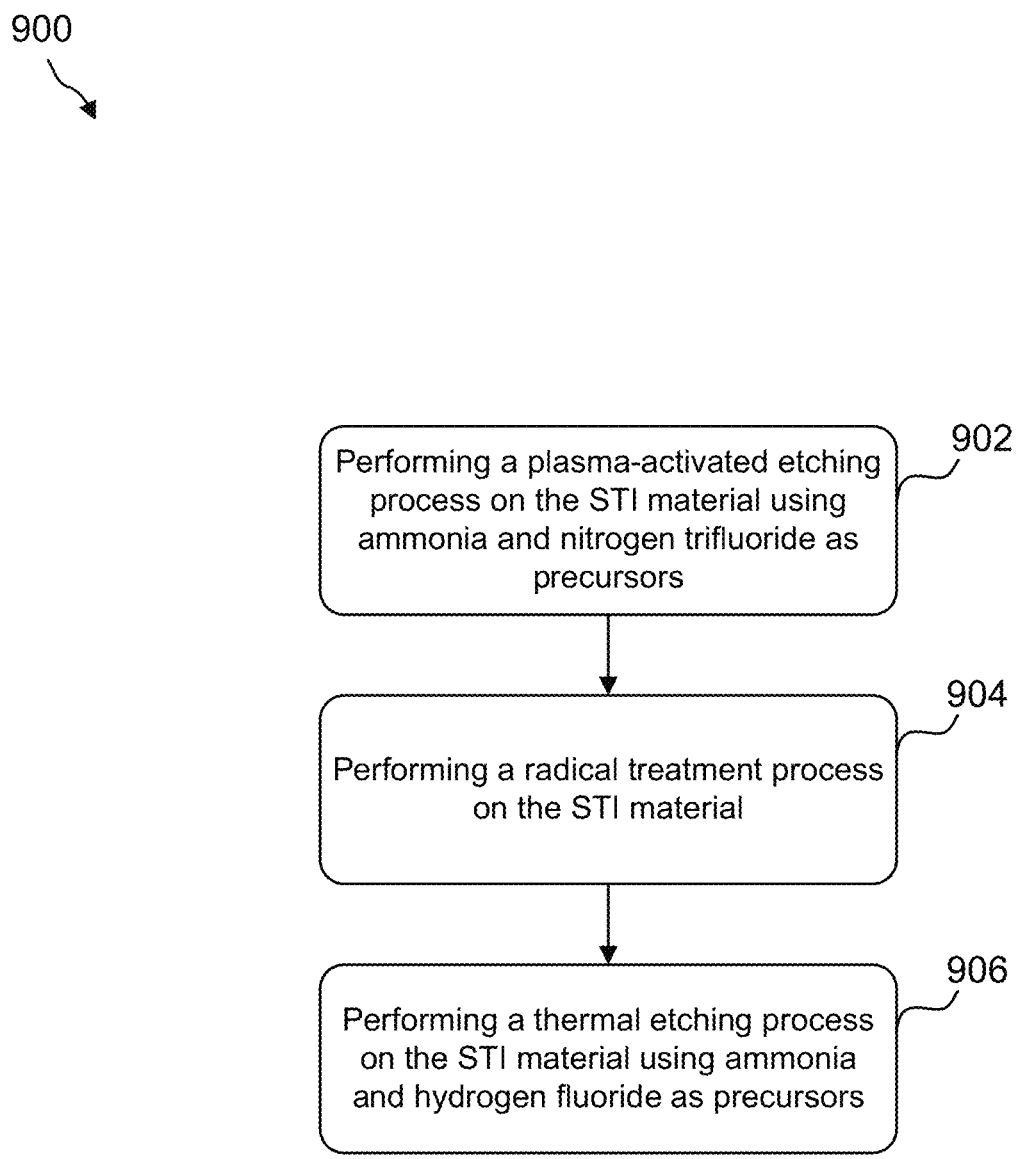

Referring to FIG. 9, method 900 can include operation 902 that includes a plasma-activated etching process, operation 904 that includes a radical treatment process, and operation 906 that includes a thermal etching process. In some embodiments, the plasma-activated etching process in operation 902 can be similar to second etching process 502 described with reference to FIG. 5. For example, the plasma-activated etching process in operation 902 can have different etching rates on inner portions and outer portions of the STI material. In some embodiments, the removed material from the outer portions of the STI material can have a height between about 10% and 35% of the total height of the STI material to be removed. Operation 904 can include a radical treatment process that is similar to radical treatment process 602 described in FIG. 6. For example, a hydrogen radical treatment process can be performed to further remove STI material. In some embodiments, the thermal etching process of operation 906 can be similar to first etching process 402 described in FIG. 4. For example, the thermal etching process of operation 906 can remove STI material at a greater rate in the outer portions of the STI material than the inner portions of the STI material. In some embodiments, the removed material from the outer portions of the STI material during operation 906 can be between about 65% and about 90% of the total height of the STI material to be removed.

Figure 10:
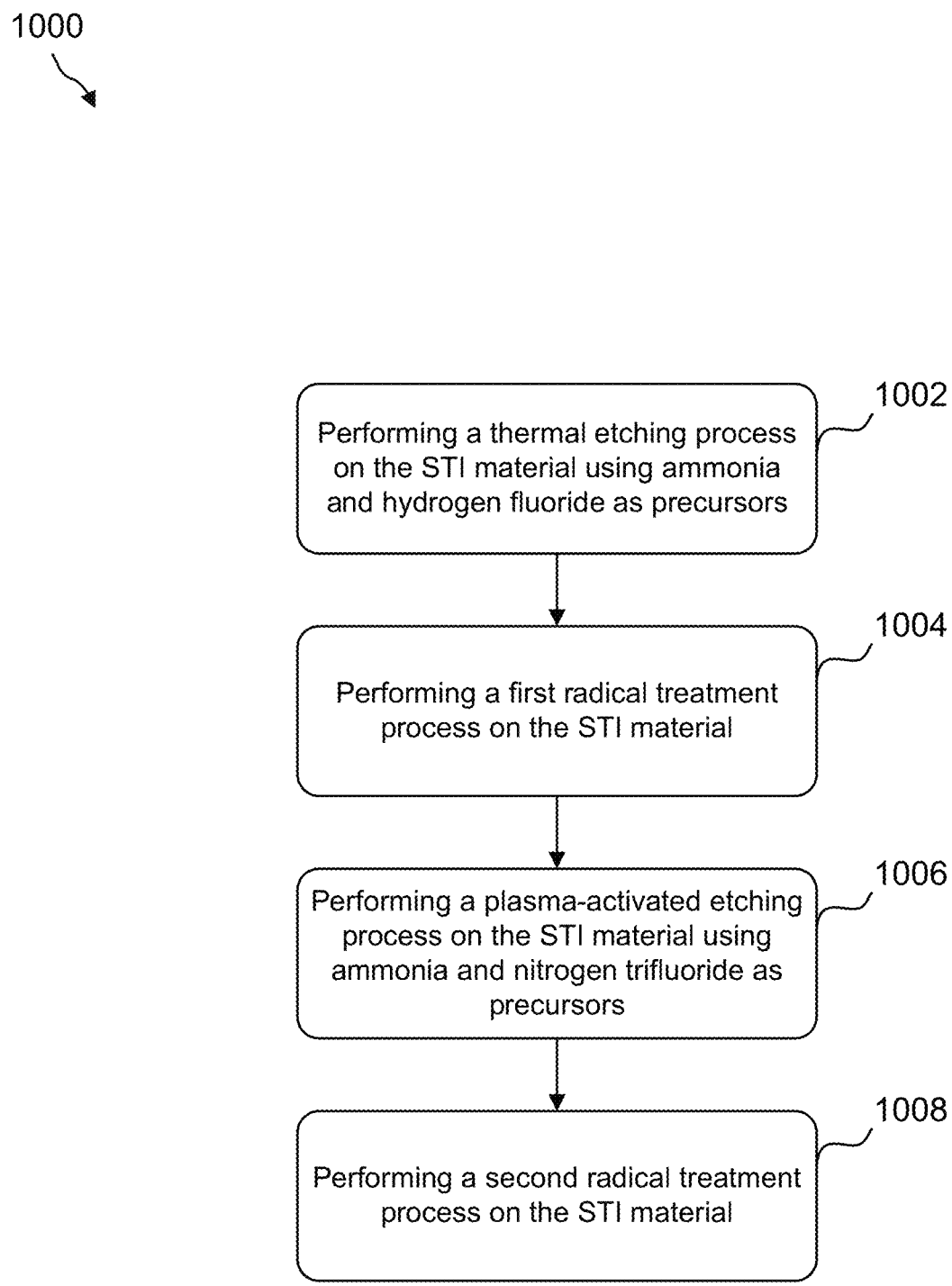

Referring to FIG. 10, method 1000 can include operation 1002 that includes a thermal etching process, operation 1004 that includes a first radical treatment process, operation 1006 that includes a plasma-activated etching process, and operation 1008 that includes a second thermal etching process. In some embodiments, the thermal etching process of operation 1002 can be similar to first etching process 402 described in FIG. 4. For example, the thermal etching process of operation 1002 can remove STI material at a greater rate in the outer portions of the STI material than the inner portions of the STI material. In some embodiments, the removed material from the outer portions of the STI material during operation 1002 can be between about 65% and about 90% of the total height of the STI material to be removed. Operation 1004 can include a first radical treatment process that is similar to radical treatment process 602 described in FIG. 6. For example, a hydrogen radical treatment process can be performed to further remove STI material. In some embodiments, the plasma-activated etching process in operation 1006 can be similar to second etching process 502 described with reference to FIG. 5. For example, the plasma-activated etching process in operation 1006 can have different etching rates on inner portions and outer portions of the STI material. In some embodiments, the removed material from the outer portions of the STI material can have a height between about 10% and 35% of the total height of the STI material to be removed. In some embodiments, the second radical treatment process in operation 1008 can be similar to first radical treatment in operation 1004. In some embodiments, each of the first and second radical treatment processes in operations 1004 and 1008 can etch back about 1% to about 5% of the total STI material to be removed.

Figure 11:
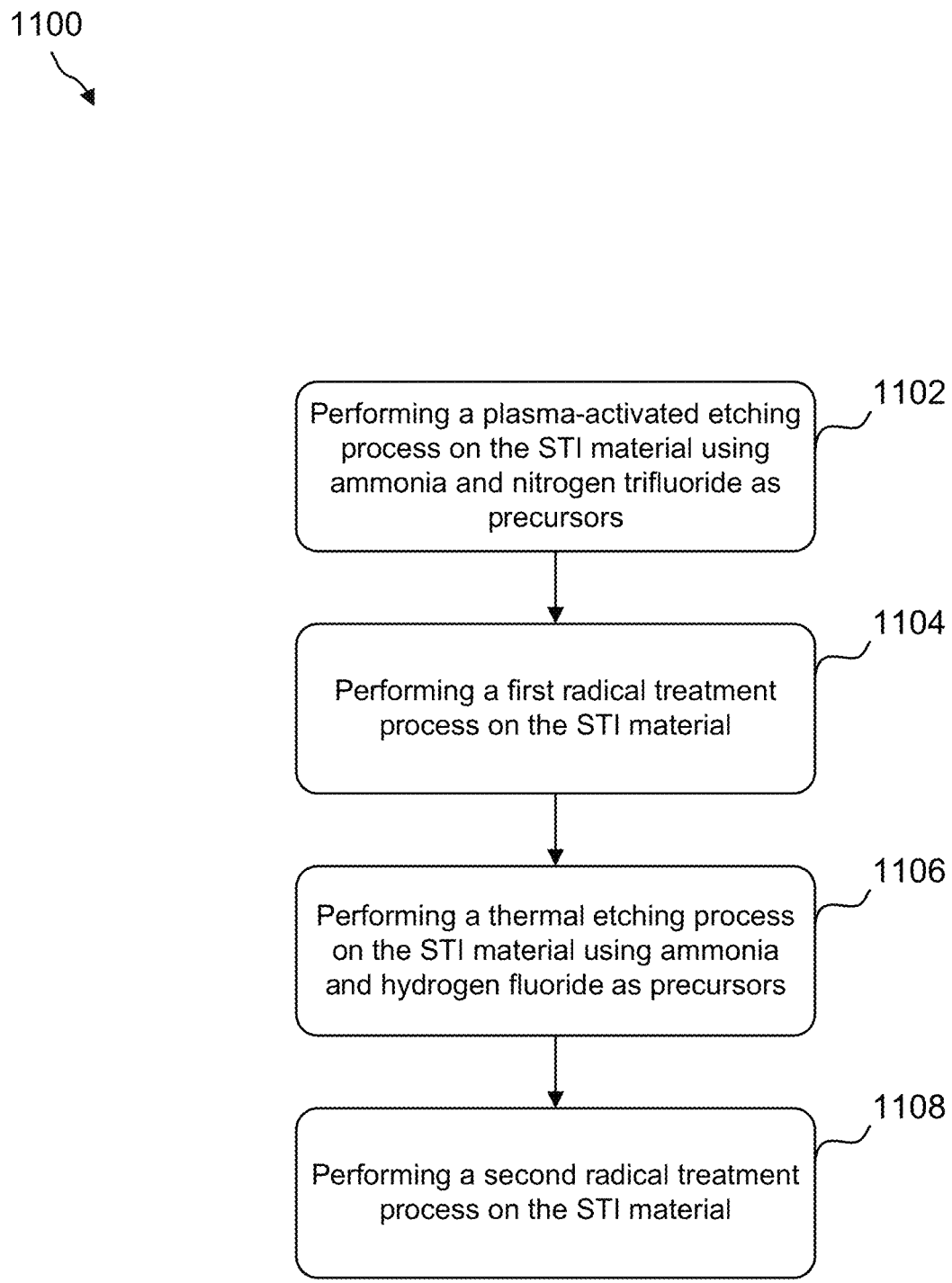

Referring to FIG. 11, method 1100 can include operation 1102 that includes a plasma-activated etching process, operation 1104 that includes a first radical treatment process, operation 1106 that includes a thermal etching process, and operation 1108 that includes a second radical treatment process. In some embodiments, the plasma-activated etching process in operation 1102 can be similar to second etching process 502 described with reference to FIG. 5. For example, the plasma-activated etching process in operation 1102 can have different etching rates on inner portions and outer portions of the STI material. In some embodiments, the removed material from the outer portions of the STI material can have a height between about 10% and 35% of the total height of the STI material to be removed. Operation 1104 can include a first radical treatment process that is similar to radical treatment process 602 described in FIG. 6. For example, a hydrogen radical treatment process can be performed to further remove STI material. In some embodiments, the thermal etching process of operation 1106 can be similar to first etching process 402 described in FIG. 4. For example, the thermal etching process of operation 1106 can remove STI material at a greater rate in the outer portions of the STI material than the inner portions of the STI material. In some embodiments, the removed material from the outer portions of the STI material during operation 1002 can be between about 65% and about 90% of the total height of the STI material to be removed. In some embodiments, the second radical treatment process in operation 1108 can be similar to first radical treatment in operation 1104. In some embodiments, each of the first and second radical treatment processes in operations 1104 and 1108 can etch back about 1% to about 5% of the total STI material to be removed.

Figure 12:
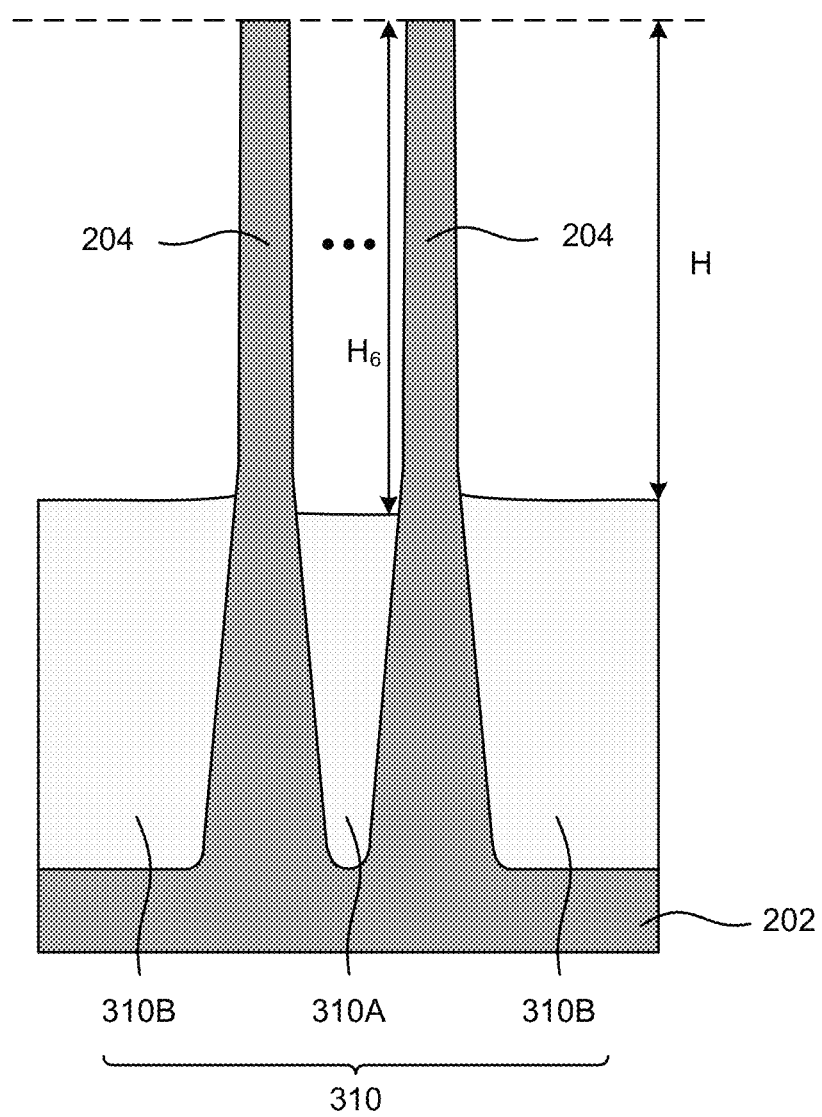
FIG. 12 is a cross-sectional view of a semiconductor device, in accordance with some embodiments.

The thermal etching processes and plasma-activated etching process can provide etched-back STI material with substantially coplanar top surfaces. In some embodiments, the etching processes can also provide inner portions of etched-back STI material with top surfaces that are lower than the top surfaces of the outer portions of the etched-back STI material. As shown in FIG. 12, a top surface of inner portions 310A can be lower than a top surface of outer portion 310B. For example, a height $H_6$ of STI material removed from between fins 204 can be greater than height H of the STI material removed from the outside of fins 204. In some embodiments, a ratio of $H_6$ over H can be greater than or equal to about 1 and less than about 1.2. In some embodiments, a difference between heights $H_6$ and H can be less than about 5 nm. For example, the difference can be between about 3 nm and about 5 nm. Increasing the difference between heights $H_6$ and H can provide benefits, among other things, more effective fin area and less gate-to-channel capacitance (CO between fin-fin spacing.

Figure 13:
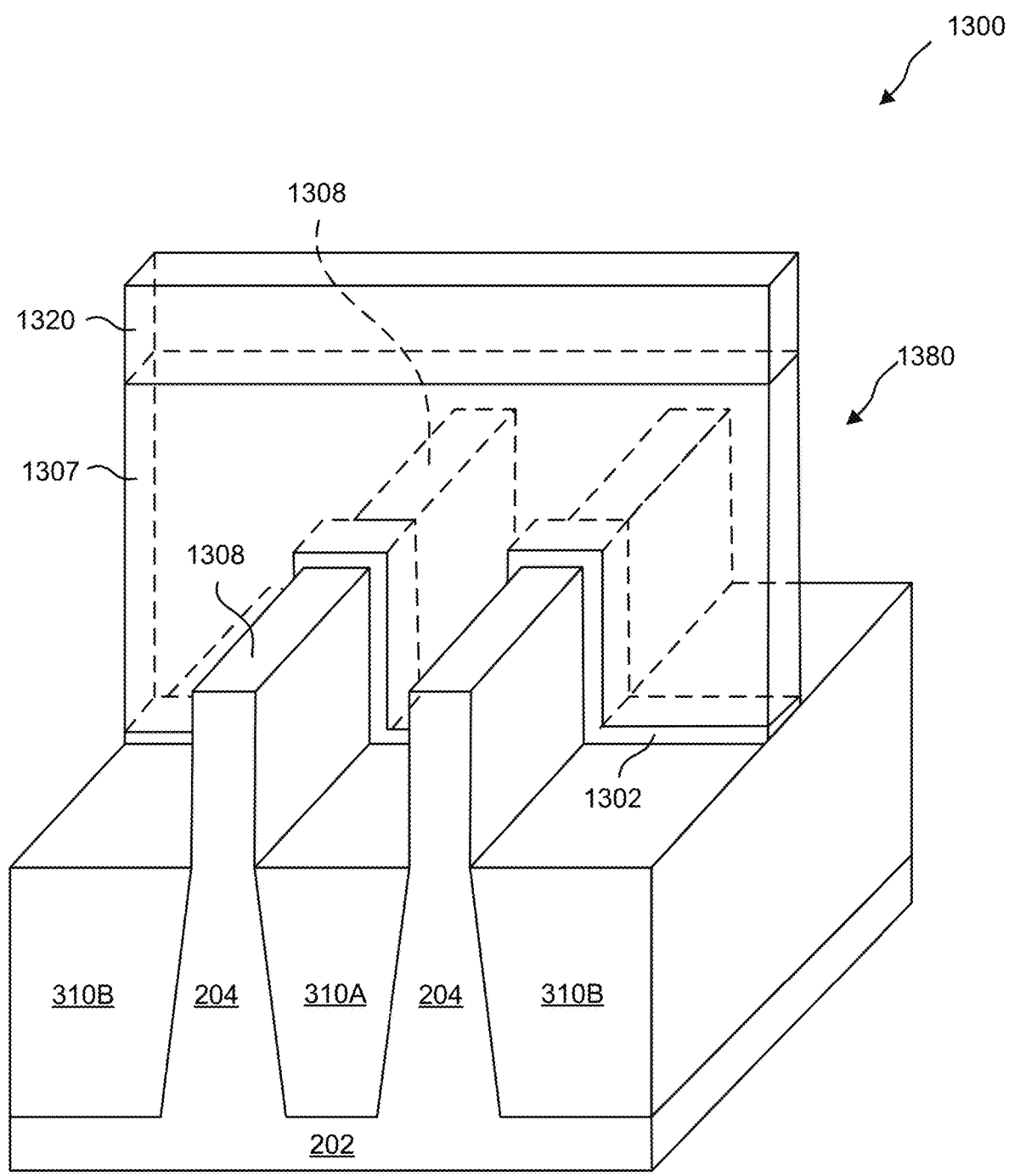
FIG. 13 is an isometric view of a semiconductor device, in accordance with some embodiments.

Referring to FIG. 1, in operation 140, structures of semiconductor devices can be formed on the STI material and on the fin structures, according to some embodiments. As shown in FIG. 13, additional structures can be formed on the protruding fins after STI material has been etched back.

FIG. 13 is an isometric view of a semiconductor structure 1300, in accordance with some embodiments of the present disclosure. Semiconductor structure 1300 includes finFETs that are formed using the fins and STI material formed using the methods and structures described with reference to FIGS. 1-12. For example, semiconductor structure 1300 includes substrate 202, multiple fins 204, STI material 310, and a gate structure 1380. Gate structure 1380 is disposed over sidewalls and a top surface of each of fins 204. Gate structure 1380 includes a gate dielectric layer 1302 and a gate electrode 1307. In some embodiments, one or more additional layers or structures can be included in gate structure 1380.

FIG. 13 shows a hard mask 1320 disposed on a top surface of gate electrode 1307. Hard mask 1320 is used to pattern, such as by etching, gate structure 1380. In some embodiments, hard mask 1320 includes a dielectric material, such as silicon nitride. The isometric view of FIG. 13 is taken after the patterning process (e.g., etching) of a gate dielectric layer and a gate electrode layer to form gate structure 1380. Integrated circuits can include multiple of such, and similar, gate structures.

Each of the multiple fins 204 includes a pair of source/drain (S/D) terminals S/D 1308. S/D 1308 are formed in, on, and/or surrounding fins 204. A channel region of fins 204 underlies gate structure 1380. S/D 1308 can be formed using doped semiconductor material, such as doped crystalline silicon. In some embodiments, S/D 1308 can be formed using silicon germanium.

STI material 310 can partially fill the recesses and can include a dielectric material such as, for example, silicon oxide, spin-on-glass, silicon nitride, silicon oxynitride, fluorine-doped silicate glass (FSG), a low-k dielectric material, other suitable insulating material, and/or combinations thereof. STI material 310 can include a multi-layer structure such as, for example, a structure with one or more liner layers. STI material 310 can also be formed by depositing an enhanced gap fill layer using multi-step deposition and treatment process to eliminate voids and seams in the gap fill material. STI material 310 can be etched back using the methods described in FIGS. 1-12.

Gate structure 1380 can include a gate dielectric layer 1302, a gate electrode 1307, and/or one or more additional layers, according to some embodiments. In some embodiments, gate structure 1380 uses polysilicon as gate electrode 1307. Although gate structure 1380 is described as using polysilicon or amorphous silicon for gate electrode 1307, gate structure 1380 can be a sacrificial gate structure, such as a gate structure formed in a replacement gate process for a metal gate structure. The metal gate structure can include barrier layer(s), gate dielectric layer(s), work function layer(s), fill metal layer(s), and/or other suitable materials for a metal gate structure. In some embodiments, the metal gate structure can include capping layers, etch stop layers, and/or other suitable materials.

P-type and n-type work function metals can be included in the metal gate structure. A work function is associated with the material composition of the work function layer. Thus, the material of a work function layer can be chosen to tune its work function so that a desired threshold voltage Vth is achieved by a device formed in the respective region.

A fill metal layer can be deposited over the work function metal layer(s). The fill metal layer fills in remaining portions of trenches or openings formed by removal of the sacrificial gate structure. The fill metal layer can include Al, W, copper (Cu), and/or other suitable materials. The fill metal can be formed by ALD, CVD, physical vapor deposition (PVD), plating, other suitable processes, and/or combinations thereof.

Semiconductor structure 1300 described above includes fins 204 and gate structure 1380. Semiconductor structure 1300 can include multiple gate structures 108 formed over fins 204. Semiconductor structure 1300 can include additional processing to form various features such as, for example, lightly-doped-drain (LDD) regions and doped S/D structures. The term "LDD region" is used to describe lightly-doped regions disposed between a channel region of a transistor and at least one of the transistor's S/D regions. LDD regions can be formed in fins 204 by doping. Ion implantation can be used, for example, for the doping process. Other processes can be used for doping the LDD regions.

Various embodiments in the present disclosure describe methods for forming semiconductor devices with substantially uniform STI step heights. An STI material can be deposited on a substrate and surround multiple fins, followed by an etch back process to expose portions of the fins. Semiconductor devices formed using the methods disclosed herein can have substantially uniform STI step heights across multiple fins. In some embodiments, an inner STI step height can be substantially equal to or less than an outer STI step height. Multiple etching processes can be used to achieve the substantially uniform STI step heights. For example, the etching back process can include etching processes that removes STI material at different rates depending on the location of the targeted STI material. The etched STI material can be exposed to a radical treatment process, which can adjust the surface profile of the STI material as well as further etching the STI material.

In some embodiments, a method includes forming a fin protruding from a substrate, the fin including a first sidewall and a second sidewall formed opposite to the first sidewall. The method also includes depositing a shallow-trench isolation (STI) material on the substrate. Depositing the STI material includes depositing a first portion of the STI material in contact with the first sidewall and depositing a second portion of the STI material in contact with the second sidewall. The method also includes performing a first etching process on the STI material to etch the first portion of the STI material at a first etching rate and the second portion of the STI material at a second etching rate greater than the first etching rate. The method also includes performing a second etching process on the STI material to etch the first portion of the STI material at a third etching rate and the second portion of the STI material at a fourth etching rate less than the third etching rate.

In some embodiments, a method, includes forming a plurality of fins protruding from a substrate, the plurality of fins including first and second outermost fins, wherein: the first outermost fin includes a first inner sidewall and a first outer sidewall formed opposite to the first inner sidewall; and the second outermost fin includes a second inner sidewall opposing the first inner sidewall and a second outer sidewall formed opposite to the second inner sidewall. The method also includes depositing a shallow-trench isolation (STI) material on the substrate, including depositing a first portion of the STI material between the first and second inner sidewalls and depositing a second portion of the STI material in contact with the first and second outer sidewalls. The method also includes performing a first etching process on the STI material to etch the first portion of the STI material at a first etching rate and the second portion of the STI material at a second etching rate greater than the first etching rate. The method further includes performing a second etching process on the STI material to etch the first portion of the STI material at a third etching rate and the second portion of the STI material at a fourth etching rate less than the third etching rate.

In some embodiments, a semiconductor structure includes a plurality of fins protruding from a substrate and including first and second outermost fins, wherein: the first outermost fin has first and second sidewalls opposite to each other; the second outermost fin has third and fourth sidewalls opposite to each other, wherein the second and third sidewalls face each other; and the top surfaces of the first and second outermost fins are aligned on a horizontal plane. The semiconductor structure also includes a shallow trench isolation (STI) material on the substrate, the STI material includes a first portion in contact with the first sidewall and having a first top surface, wherein a first height is measured from the first top surface to the horizontal plane. The STI material also includes a second portion between the first and second outermost fins and having a second top surface, wherein a second height is measured from the second top surface to the horizontal plane and the second height is greater than the first height.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a plurality of fins protruding from a substrate and comprising first and second outermost fins and one or more inner fins between the first and second outermost fins, wherein:
      the first outermost fin comprises first and second sidewalls opposite to each other;
      the second outermost fin comprises third and fourth sidewalls opposite to each other, wherein the second and third sidewalls face each other; and
      top surfaces of the first and second outermost fins are aligned on a horizontal plane; and
   a shallow trench isolation (STI) material on the substrate, comprising:
      a first portion in contact with the first sidewall and comprising a first top surface, wherein a first height is measured from the first top surface to the horizontal plane; and
      a second portion between the first outermost fin and an adjacent inner fin of the one or more inner fins and comprising a second top surface, wherein a second height is measured from the second top surface to the horizontal plane and the second height is greater than the first height.

2. The semiconductor structure of claim 1, wherein the second portion is in contact with the second and third sidewalls.

3. The semiconductor structure of claim 1, wherein a ratio of the second height over the first height is greater than or equal to about 1 and less than about 1.2.

4. The semiconductor structure of claim 1, wherein a difference between the second height and the first height ranges from about 3 nm to about 5 nm.

5. The semiconductor structure of claim 1, further comprising source/drain terminals and gate structures formed on the plurality of fins.

6. The semiconductor structure of claim 1, wherein the plurality of fins protrude from the first and second top surfaces of the STI material.

7. The semiconductor structure of claim 1, wherein the STI material comprises silicon oxide.

8. The semiconductor structure of claim 1, wherein each of the plurality of fins comprises a top portion having a substantially uniform width and a bottom portion having a width that gradually changes vertically.

9. The semiconductor structure of claim 8, wherein the first and second portions of the STI material are in contact with the bottom portion of the plurality of fins.

10. A semiconductor device, comprising:
first and second fins protruding from a substrate, wherein top surfaces of the first and second fins are aligned on a horizontal plane;
a shallow trench isolation (STI) material on the substrate, comprising:
an inner portion between the first and second fins and comprising a first planar top surface, wherein a first height is measured between the first planar top surface and the horizontal plane; and
an outer portion outside of the first and second fins and comprising a second planar top surface, wherein a second height is measured between the second planar top surface and the horizontal plane, and wherein the first height is greater than the second height; and
a gate structure on the STI material and the first and second fins.

11. The semiconductor device of claim 10, wherein the gate structure comprises a gate dielectric layer on the first planar top surface, the second planar top surface, and the first and second fins.

12. The semiconductor device of claim 10, further comprising one or more fins protruding from the substrate and between the first and second fins, wherein the inner portion of the STI material is between the first fin and a fin of the one or more fins adjacent to the first fin.

13. The semiconductor device of claim 10, wherein a ratio of the first height over the second height is greater than or equal to about 1 and less than about 1.2.

14. The semiconductor device of claim 10, wherein each of the first and second fins comprises a top portion having a substantially uniform width and a bottom portion having a width that gradually changes vertically.

15. The semiconductor device of claim 14, wherein the inner and outer portions of the STI material are in contact with the bottom portion of first and second fins.

16. A semiconductor device, comprising:
first and second fins on a substrate and comprising a channel region and a source/drain region, wherein top surfaces of the first and second fins are substantially coplanar;
a shallow trench isolation (STI) material on the substrate and comprising a first portion between the first and second fins and a second portion outside the first and second fins, wherein:
the first portion comprises a first top surface measured a first distance from the top surfaces of the first and second fins;
the second portion comprises a second top surface measured a second distance from the top surfaces of the first and second fins;
the channel region and the source/drain region protrude from the first and second top surfaces; and
the first distance is greater than the second distance; and
a common gate structure on the channel region and the first and second top surfaces.

17. The semiconductor device of claim 16, wherein the first and second fins further comprise a lightly doped region between the channel region and the source/drain region.

18. The semiconductor device of claim 16, further comprising one or more fins protruding from the substrate and between the first and second fins.

19. The semiconductor device of claim 16, wherein a ratio of the first distance over the second distance is greater than or equal to about 1 and less than about 1.2.

20. The semiconductor structure of claim 1, wherein the STI material further comprises a third portion comprising a third top surface between the second outermost fin and another adjacent inner fin of the one or more inner fins, and wherein the second and third top surfaces are substantially coplanar.

* * * * *

UNITED STATES PATENT AND TRADEMARK OFFICE
CERTIFICATE OF CORRECTION

PATENT NO. : 12,237,229 B2
APPLICATION NO. : 18/323764
DATED : February 25, 2025
INVENTOR(S) : Chen et al.

It is certified that error appears in the above-identified patent and that said Letters Patent is hereby corrected as shown below:

In the Specification

In Column 11, Line 43, delete "(CO" and insert -- $C_{gc}$) --, therefor.

Signed and Sealed this
Twenty-ninth Day of April, 2025

Coke Morgan Stewart
*Acting Director of the United States Patent and Trademark Office*